(12) United States Patent
Araki

(10) Patent No.: US 6,413,658 B1
(45) Date of Patent: Jul. 2, 2002

(54) POLYMERS, LUMINESCENT DEVICE MATERIALS, AND LUMINESCENT DEVICES COMPRISING SAID MATERIALS

(75) Inventor: Katsumi Araki, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/611,321

(22) Filed: Jul. 6, 2000

(30) Foreign Application Priority Data

Jul. 6, 1999 (JP) .......................................... 11-191854

(51) Int. Cl.$^7$ .............................................. H05B 33/12
(52) U.S. Cl. ..................... 428/690; 428/704; 428/917; 313/504; 313/506; 257/40; 257/103
(58) Field of Search ................................ 428/690, 704, 428/917; 313/504, 506; 257/40, 103; 544/345, 350, 357; 549/43, 50; 528/377

(56) References Cited

U.S. PATENT DOCUMENTS 5,540,999 A * 7/1996 Yamamoto et al. ......... 428/690
6,242,561 B1 * 6/2001 Möhwald et al. ........... 528/377

FOREIGN PATENT DOCUMENTS

DE         197 09 185 A1    10/1997
WO         WO 97/32914       9/1997

OTHER PUBLICATIONS

Nayak et al., "The Interplay between Geometric and Electronic Structures in . . . Polythieno(3,4–b)quinoxaline", Macromolecules, vol. 23, No. 8 (Apr. 16, 1990), pp. 2237–2245.*
Kastner et al., "Raman Spectra of Poly(2,3–R,R–thieno[3,4–b]pyrazine). A New Low–Band–Gap Polymer", Macromolecules, vol. 28, No. 8 (Apr. 10, 1995), pp. 2922–2929.*
Tanaka et al, "A Novel Monomer Candidate for Intrisically Conductive Organic Polymers Based on Nonclassical Thiophene", Synthetic Metals, vol. 84 (Jan. 1997), pp. 229–230.*

Köhler et al., "Donor–acceptor interactions in organometallic and organic poly–ynes", Synthetic Metals, vol. 101 (May 1999), pp. 246–247.*
Nonlinear Optical Properties of Novel Low–Bandgap Polythiophenes, vol. 15, No. 2, Feb. 1998, Journal of Optical Society of America, pp. 889–894.
J. Phys.: Condens. Matter, "An efficient electron–transporting polymer for light–emitting diodes", S. Dailey et al, 10 (1998) 5171–5178. (no month).
Kobunshi Ronbun–shu, vol. 55, No. 5, (May, 1998) pp. 277–283.

* cited by examiner

Primary Examiner—Marie Yamnitzky
(74) Attorney, Agent, or Firm—Sughrue Mion, PLLC

(57) ABSTRACT

Polymers suitable for luminescent device materials, which contain in their main chain or side chains at least one thienopyrazine structure represented by the following formula (I) to ensure for electroluminescent devices high electron-injection receptivity and high electron-transporting ability:

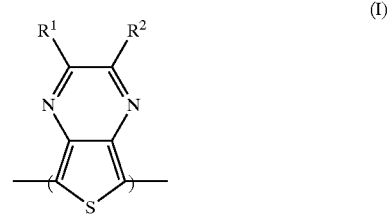

(I)

wherein $R^1$ and $R^2$ are the same or different, and each represent a hydrogen atom, a substituted or unsubstituted alkyl group, a substituted or unsubstituted aryl group, a substituted or unsubstituted alkoxy group, a substituted or unsubstituted aryloxy group, a substituted or unsubstituted alkylthio group, a substituted or unsubstituted arylthio group, a substituted or unsubstituted amino group, a substituted or unsubstituted heteroaryl group, or a substituted or unsubstituted aliphatic heterocyclic group; and $R^1$ and $R^2$ may combine with each other to form a ring.

2 Claims, No Drawings

POLYMERS, LUMINESCENT DEVICE MATERIALS, AND LUMINESCENT DEVICES COMPRISING SAID MATERIALS

FIELD OF THE INVENTION

The present invention relates to polymers having high electric conductivity, materials for luminescent devices capable of exhibiting luminescence by converting electric energy into light, and luminescent devices. In particular, the invention is concerned with luminescent devices suitably used in the fields of indication devices, display, back light, electrophotography, illumination light sources, recording light sources, reader light sources, beacons, billboards and interior decoration.

BACKGROUND OF THE INVENTION

Nowadays, there are lively researches and developments of various display devices. In particular, organic luminescent devices attract attention as promising display devices because they can exhibit luminescence of high luminance under a low voltage. For instance, luminescent devices comprising organic thin films formed by evaporation of organic compounds are known (*Applied Physics Letters*, vol. 51, p. 913 (1987). However, the luminescent device production accompanied by the evaporating operation of organic compounds has a problem with productivity. Therefore, the device production utilizing coating methods is preferable from the viewpoints of simplification of production steps, processing efficiency and expansion of image sizes.

As luminescent device materials used for producing luminescent devices in accordance with coating methods favorable for productivity, there are known the polymers having π-conjugated systems represented by paraphenylenevinylene (PPV). In view of color tone, luminous intensity and durability, however, they have many problems with their practical use.

As another luminescent device produced using coating methods, there is known the device containing a low molecular fluorescent compound dispersed in poly(N-vinylcarbazole) (JP-A-4-212286, wherein the term "JP-A" as used herein means an "unexamined published Japanese patent application"). According to this method, the species of the fluorescent compound used in the device can be arbitrarily changed, so that the color tone and the luminous intensity can be adjusted with relatively ease. However, such a device requires a high operating voltage, and besides, it tends to cause a lowering of luminous intensity when its operation is resumed after a long-term lapse or continues for a long time, namely it has a rawback of being inferior in durability.

The cause of such drawbacks is attributed, in part, to shortages of electron injection property and electron transporting property, and so it has been attempted to develop various electron injection and electron transporting polymers.

However, no polymers having satisfactory physical properties as well as those abilities have been developed yet. For instance, polyacetylene well-known as an electron-transporting (electrically conductive) polymer has a problem with its solubility and film formability, and so it is unsuitable for device production using a coating process. And even the polymers reported in *J. Phys.: condens. Matter*, 10(1998) 5171–5178, such as poly(2,5-pyridinediyl), cannot be solutions to the pending problems, because they have various drawbacks of having no suitability for blue luminescent devices and green luminescent devices because of their narrow band gaps, lacking electron affinity (receptivity to injected electrons), having poor conductivity, and being soluble in special solvents, such as formic acid, but sparingly soluble in general organic solvents.

SUMMARY OF THE INVENTION

Therefore, objects of the invention are to provide a material for luminescent device use which not only has excellent ability to transport electrons and suitability for luminescent device production using a coating process but also ensures for the luminescent device the operability at low voltage, satisfactory luminous characteristics and high stability under repeated use, and further to provide a luminescent device comprising such a material.

The aforementioned objects are attained with the following means:

[1] A luminescent device material comprising a polymer having at least one partial structure represented by the following formula (I):

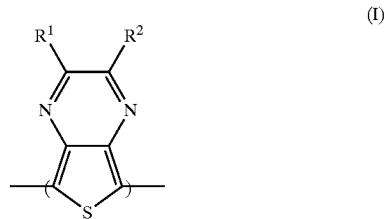

wherein $R^1$ and $R^2$, which may be the same or different, each represent a hydrogen atom, a substituted or unsubstituted alkyl group, a substituted or unsubstituted aryl group, a substituted or unsubstituted alkoxy group, a substituted or unsubstituted aryloxy group, a substituted or unsubstituted alkylthio group, a substituted or unsubstituted arylthio group, a substituted or unsubstituted amino group, a substituted or unsubstituted heteroaryl group, or a substituted or unsubstituted aliphatic heterocyclic group; and $R^1$ and $R^2$ may combine with each other to complete a ring.

[2] A polymer represented by the following formula (II):

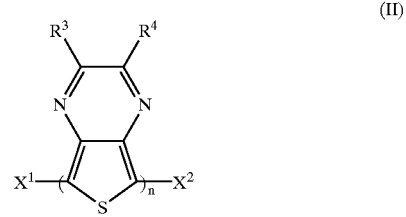

wherein $R^3$ and $R^4$, which may be the same or different, each represent a substituted or unsubstituted aryl group except for an unsubstituted phenyl group, a substituted or unsubstituted aralkyl group, a substituted or unsubstituted aryl group which has a condensed ring (hereinafter sometimes referred to as a substituted or unsubstituted ring-condensed aryl group), a substituted or unsubstituted aryloxy group, a substituted or unsubstituted alkylthio group, a substituted or unsubstituted arylthio group, a substituted or unsubstituted amino group, a substituted or unsubstituted nitrogen-containing heteroaryl group, a substituted or unsubstituted oxygen-containing heteroaryl group, or a substituted or unsubstituted aliphatic heterocyclic group, and $R^3$ and $R^4$ may combine with each other to complete a ring; $X^1$ and $X^2$, which may be the same or different, each represent a hydrogen atom, a halogen atom, an aliphatic hydrocarbon group, an aromatic hydrocarbon group or an aromatic heterocyclic group, and $X^1$ and $X^2$ may combine with each other to complete a ring; and n is an integer of at least 2.

[3] A luminescent device having a luminescent layer or at least two thin organic compound layers, inclusive of a luminescent layer, between a pair of electrodes; at least one of the layers comprising at least one polymer as described in the means [1] or [2].

[4] A luminescent device having a luminescent layer or at least two thin organic compound layers, inclusive of a luminescent layer, between a pair of electrodes; at least one of the layers being a filmy layer formed by coating at least one polymer as described in the means [1] or [2].

DETAILED DESCRIPTION OF THE INVENTION

The invention is illustrated below in detail.

The present polymer is a polymer having a partial structure represented by formula (I) in its main chain and/or side chains, preferably a compound containing at least one repeating unit represented by formula (I).

The polymer having a partial structure represented by formula (I) has a low band gap, high electron affinity and good solubility in organic solvents, and works well for injection of electrons, transportation of electrons and luminescent device production using a coating process.

In formula (1), it is desirable for $R^1$ and $R^2$ each to be a hydrogen atom, a substituted or unsubstituted alkyl group containing up to 20 carbon atoms in all, a substituted or unsubstituted aryl group containing up to 20 carbon atoms in all, a substituted or unsubstituted alkoxy group containing up to 20 carbon atoms in all, a substituted or unsubstituted aryloxy group containing up to 20 carbon atoms in all, a substituted or unsubstituted alkylthio group containing up to carbon atoms in all, a substituted or unsubstituted arylthio group containing up to 20 carbon atoms in all, a substituted or unsubstituted amino group containing up to 40 carbon atoms in all, a substituted or unsubstituted heteroaryl group containing up to 20 carbon atoms in all, or a substituted or unsubstituted aliphatic heterocyclic group containing up to 20 carbon atoms in all. Of these groups, the groups preferred as $R^1$ and $R^2$ each include alkyl groups containing 3 to 16 carbon atoms, alkoxy groups containing 3 to 16 carbon atoms, alkylthio groups containing 3 to 16 carbon atoms, aralkyl groups containing 3 to 16 carbon atoms, dialkylamino groups containing 2 to 24 carbon atoms, a phenyl group, a naphthyl group, alkylphenyl groups, alkoxyphenyl groups, alkylthiophenyl groups, halogenophenyl groups, a pyridyl group, a pyrazinyl group, a thienyl group, a quinolyl group, a quinoxalyl group, a naphthyridyl group, a pyrimidyl group, a furyl group, a tetrahydrofuryl group, a pyrrolyl group, a pyrazolyl group, an imidazolyl group, a triazolyl group, a thiazolyl group, a thiadiazolyl group, an oxazolyl group, an oxadiazolyl group, a triazinyl group, a pyridazinyl group, a morpholino group, a piperidyl group and piperazinyl group. In particular, the groups advantageous over the others are n-butyl, n-hexyl, n-octyl, 2-ethylhexyl, n-nonyl, n-decyl, n-dodecyl, n-butyloxy, n-hexyloxy, n-octyloxy, 2-ethylhexyloxy, n-nonyloxy, n-decyloxy, n-dodecyloxy, octadecyloxy, n-butylthio, n-hexylthio, n-octylthio, 2-ethylhexylthio, n-decylthio, n-dodecylthio, benzyl, phenetyl, dimethylamino, diethylamino, dibutylamino, dihexylamino, dioctylamino, phenyl, naphthyl, biphenyl, tolyl, methoxyphenyl, methylthiophenyl, chlorophenyl, fluorophenyl, pyridyl, pyrazinyl, thienyl, quinolyl, quinoxalyl, naphthyridyl, pyrimidyl, furyl, pyrrolyl, pyrazolyl, imidazolyl, triazolyl, thiazolyl, thiadiazolyl, oxazolyl, oxadiazolyl, triazinyl, pyridazinyl, morpholino, piperidyl and piperazinyl groups. The groups represented by $R^1$ and $R^2$ may be the same or different. And they may combine with each other to complete a ring. The present novel polymers are compounds represented by formula (II), and they are useful as electrically conductive polymers, electron-transporting polymers and electron injection polymers.

In formula (II), it is desirable for $R^3$ and $R^4$ each to be a substituted or unsubstituted aryl group (except for an unsubstituted phenyl group) containing up to 20 carbon atoms in all (e.g., a substituted phenyl, a substituted or unsubstituted naphthyl group, a substituted or unsubstituted anthracenyl group), a substituted or unsubstituted aralkyl group containing up to 20 carbon atoms in all, a substituted or unsubstituted aryl group which has a condensed ring, containing up to 20 carbon atoms in all, a substituted or unsubstituted aryloxy group containing up to 20 carbon atoms in all, a substituted or unsubstituted alkylthio group containing up to 20 carbon atoms in all, a substituted or unsubstituted arylthio group containing up to 20 carbon atoms in all, a substituted or unsubstituted amino group containing up to 40 carbon atoms in all, a substituted or unsubstituted nitrogen-containing heteroaryl group containing up to 20 carbon atoms in all, a substituted or unsubstituted oxygen-containing heteroaryl group containing up to 20 carbon atoms in all, or a substituted or unsubstituted aliphatic heterocyclic group containing up to 20 carbon atoms in all. Of these groups, the groups preferred as $R^3$ and $R^4$ each are alkylthio groups containing 3 to 16 carbon atoms, dialkylamino groups containing 2 to 24 carbon atoms, a naphthyl group, alkylphenyl groups, alkoxyphenyl groups, alkylthiophenyl groups, halogenophenyl groups, a pyridyl group, a pyrazinyl group, a quinolyl group, a quinoxalyl group, a naphthyridyl group, a pyrimidyl group, a furyl group, a pyrrolyl group, a pyrazolyl group, an imidazolyl group, a triazolyl group, a thiazolyl group, a thiadiazolyl group, an oxazolyl group, an oxadiazolyl group, a triazinyl group and a pyridazinyl group, a tetrahydrofuryl group, a morpholino group, a piperidyl group and piperazinyl group. In particular, the groups advantageous over the others are n-butylthio, n-hexylthio, n-octylthio, 2-ethylhexylthio, n-decylthio, n-dodecylthio, benzyl, phenetyl, dimethylamino, diethylamino, dibutylamino, dihexylamino, dioctylamino, naphthyl, biphenylyl, tolyl, methoxyphenyl, methylthiophenyl, chlorophenyl, fluorophenyl, pyridyl, pyrazinyl, morpholino, piperidyl, piperazinyl, quinolyl, quinoxalyl, naphthyridyl, pyrimidyl, furyl, pyrrolyl, pyrazolyl, imidazolyl, triazolyl, thiazolyl, thiadiazolyl, oxazolyl, oxadiazolyl, triazinyl and pyridazinyl groups. The groups represented by $R^3$ and $R^4$ may be the same or different. And they may combine with each other to complete a ring. n is an integer of at least 2.

The substance exhibiting luminescence in the invention may be a polymer having a partial structure represented by formula (I) or (II), or another luminescent polymer, or a luminescent low molecular weight compound.

The present polymers having partial structures represented by formula (I) may be homopolymers or copolymers containing other monomer units. These copolymers may be random copolymers or block copolymers.

Examples of other monomers usable for the present copolymers include aromatic amine compounds, aromatic silane compounds, vinylsilane compounds, aromatic hydrocarbon compounds and aromatic heterocyclic compounds. The proportion of monomer units having partial structures represented by formula (I) in the present copolymer has no particular limits, but it is specifically from 0.0001 to 99.9999% by mole.

The number average molecular weight (Mn) of the polymer having partial structure (s) represented by formula (I) and that of the polymer represented by formula (II) depend on the species of substituent groups they have, so they are variable. However, the suitable range thereof is from 200 to 1,000,000, preferably from 200 to 500,000, particularly preferably from 200 to 100,000. The weight average molecular weight (Mw) of the present polymers are also variable depending on the substituent groups they have, but the suitable range thereof is from 200 to 1,000,000, preferably from 200 to 500,000, particularly preferably from 200 to 300,000.

Further, the present polymers may contain in each molecule the skeletal part(s) having a hole transporter function, an electron transporter function or/and a luminescence function.

Examples of a polymer having partial structures represented by formula (I) are illustrated below, but these examples should not be construed as limiting the scope of the invention in any way.

1
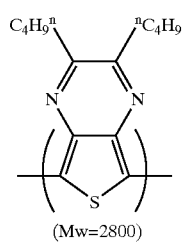
(Mw=2800)

2
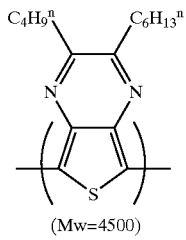
(Mw=4500)

3
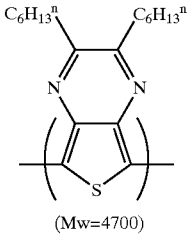
(Mw=4700)

4
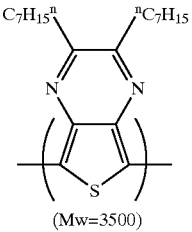
(Mw=3500)

-continued

5
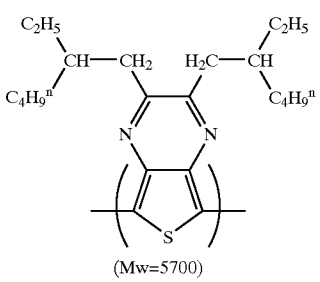
(Mw=5700)

6
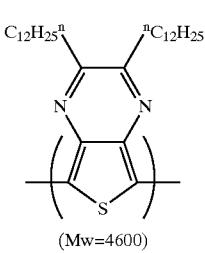
(Mw=4600)

7
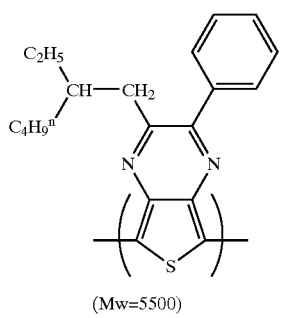
(Mw=5500)

8
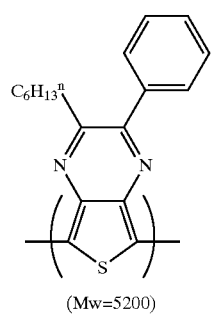
(Mw=5200)

9
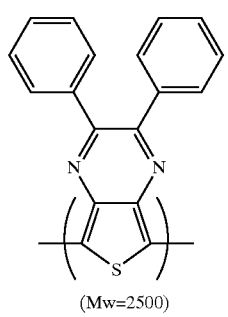
(Mw=2500)

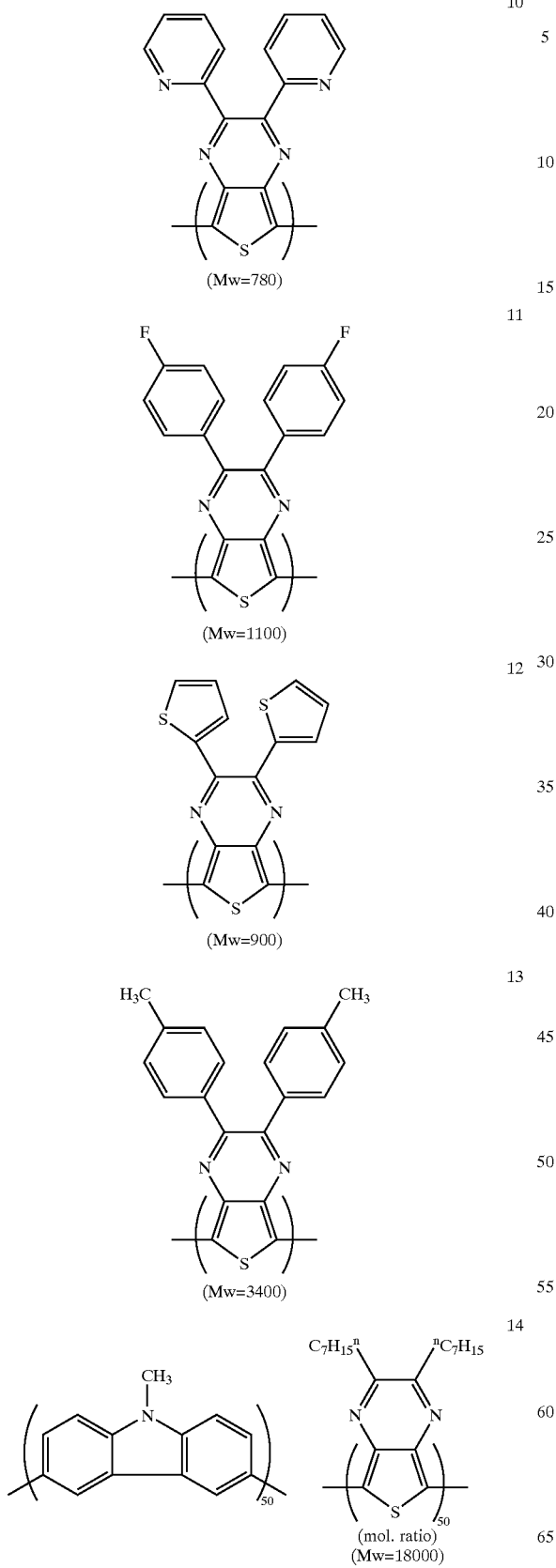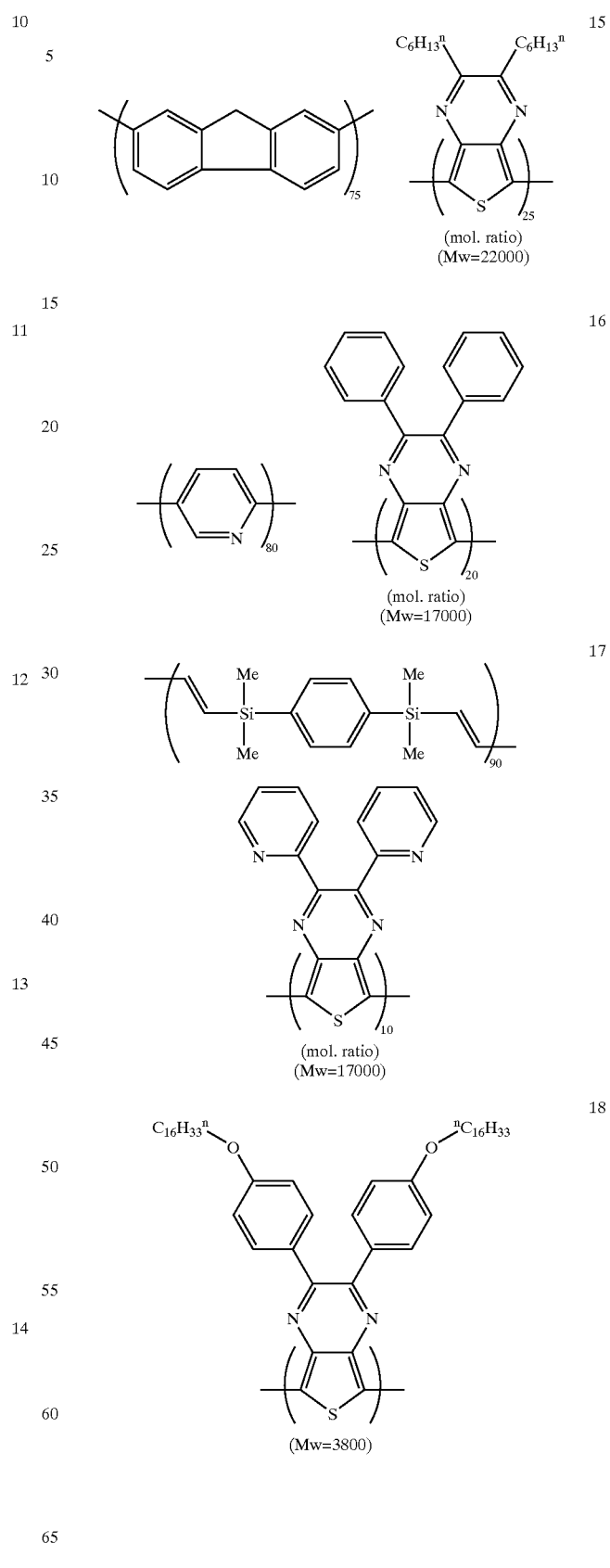

19
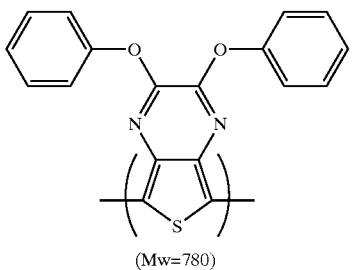
(Mw=780)
20
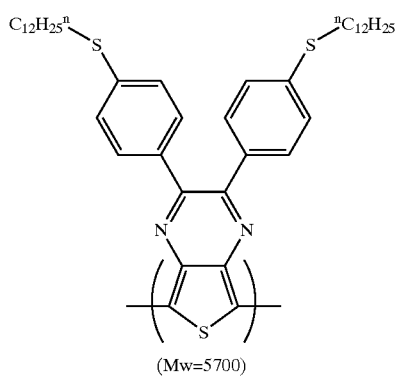
(Mw=5700)
21
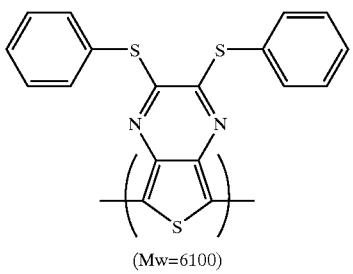
(Mw=6100)
22
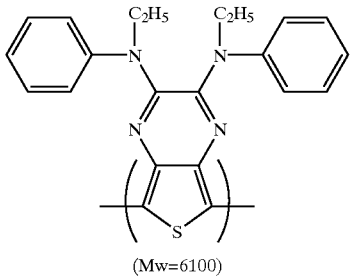
(Mw=6100)
23
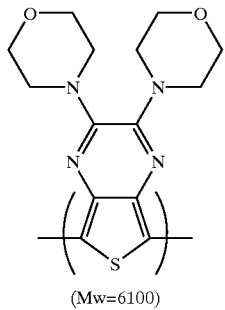
(Mw=6100)
Examples of a polymer represented by formula (II) are illustrated below, but these examples should not be construed as limiting the scope of the invention in anyway. Additionally, $X^1$, $X^2$ and n each may be selected properly depending on the desired purposes and uses.
24
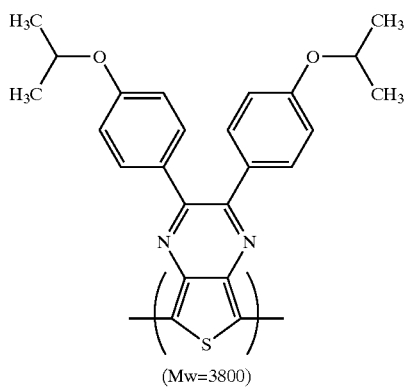
(Mw=3800)
25
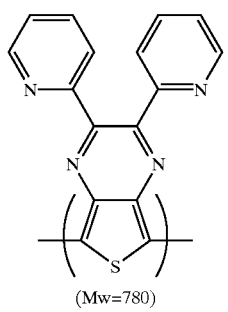
(Mw=780)
26
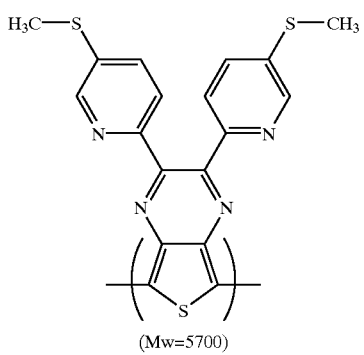
(Mw=5700)
27
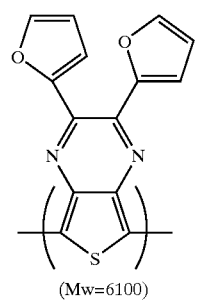
(Mw=6100)

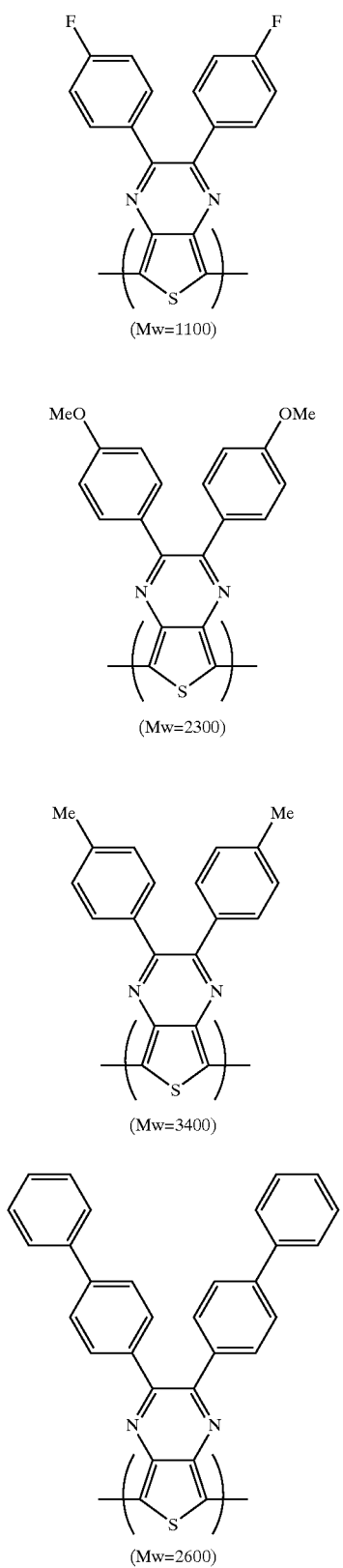
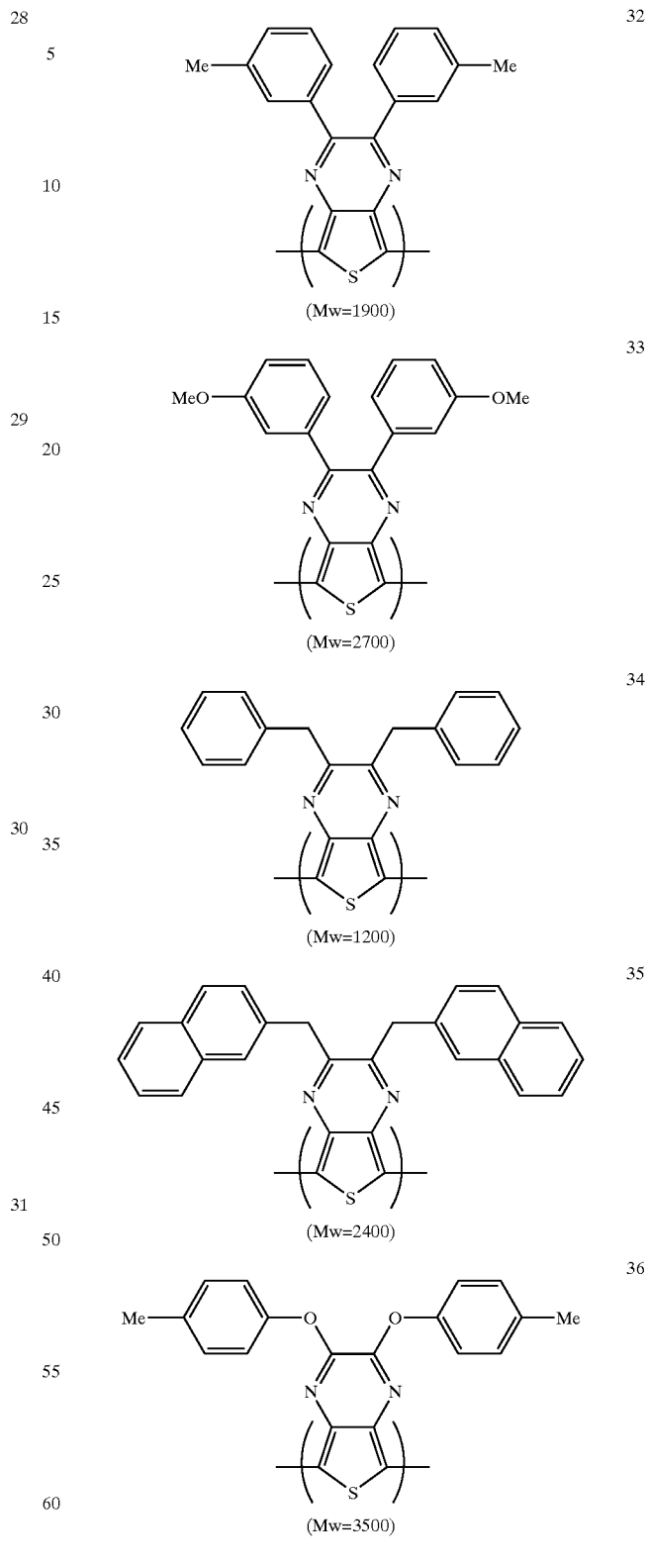

-continued

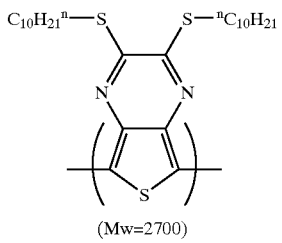
37
(Mw=2700)

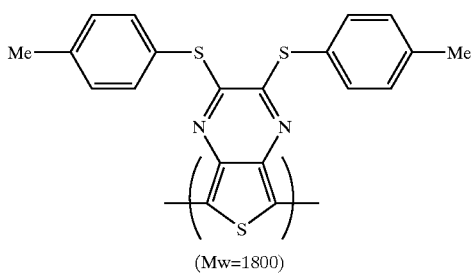
38
(Mw=1800)

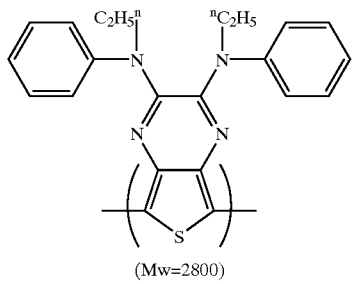
39
(Mw=2800)

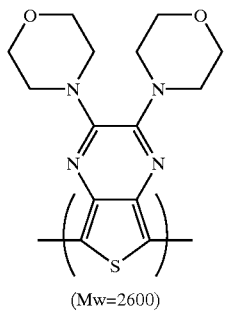
40
(Mw=2600)

The present polymers can be synthesized using every polymerization method that can synthesize them. For instance, they can be synthesized using Heck reaction, Suzuki coupling reaction or an oxidative polymerization method. Examples of polymerization can be found, e.g., in *Kobunshi Ronbun-shu* (which means "Collected Theses on Polymers"), vol. 55, No. 5, pp. 277–283 (May, 1998). By contrast to radical polymerization methods, the adoption of those methods sometimes provide polymers having relatively low molecular weight ranging from several hundreds to several thousands.

As to the polymerization solvents, every solvent can be used without particular restrictions. Specifically, aromatic hydrocarbon solvents (e.g., benzene, toluene), halogenated hydrocarbon solvents (e.g., dichloroethane, chloroform) ether solvents (e.g., tetrahydrofuran, dioxane), amide solvents (e.g., dimethylformamide, dimethylacetamide), ester solvents (e.g., ethyl acetate), alcohol solvents (e.g., methanol) and ketone solvents (e.g., acetone, cyclohexanone) can be used. By making a proper selection of solvent(s), it also becomes possible to carry out solution polymerization, namely polymerization in a homogeneous system, and precipitation polymerization involving the precipitation of a polymer produced.

Every luminescent device according to the invention is a device having a luminescent layer or at least two thin layers of organic compounds, inclusive of a luminescent layer, between a pair of electrodes, namely an anode and a cathode. The thin layers the device may have in addition to the luminescent layer are, e.g., a hole injection layer, a hole transporting layer, an electron injection layer, an electron transporting layer and a protective layer. These layers each may have another function also. A vide variety of materials can be used for forming each of those layers.

The anode supplies holes to a hole injection layer, a hole transporting layer and a luminescent layer. As a material for the anode, metals, alloys, metal oxides, electrically conductive materials and mixtures thereof, preferably materials having a work function of at least 4 eV, can be used. Examples of such materials include electrically conductive metal oxides, such as tin oxide, zinc oxide, indium oxide and indium tin oxide (ITO), metals such as gold, silver, chromium and nickel, mixtures or laminates of those metals and conductive metal oxides, electrically conductive inorganic materials such as copper iodide and copper sulfide, electrically conductive organic materials such as polyaniline, polylthiophene and polypyrrole, and laminates of those materials and ITO. Of the materials recited above, the electrically conductive metal oxides are preferred over the others. In particular, ITO is used to advantage from the viewpoints of productivity, conductivity and transparency. The suitable thickness of the anode, though can be selected depending on the anode material, is generally from 10 nm to 5 $\mu$m, preferably 50 nm to 1 $\mu$m, particularly preferably 100 nm to 500 nm.

The anode generally has an anode material formed into a layer on a soda lime glass, alkali-free glass or transparent resin substrate. In a case of using a glass substrate, alkali-free glass is preferred from the viewpoint of reduction in ions eluted from the glass. When soda glass is used as the substrate, it is desirable that the barrier coat, such as silica, be provided on the glass. The thickness of the substrate has no particular limitation as long as the substrate can ensure mechanical strength for the anode. For instance, the suitable thickness of a glass substrate is at least 0.2 mm, preferably at least 0.7 mm. The methods suitable for making the anode vary with the material used. In the case of ITO, for example, the film formation can be carried out using an electron-beam method, a sputtering method, a resistance heating-utilized vapor deposition method, a chemical reaction method (e.g., sol-gel method) or the method of coating a dispersion of indium tin oxide. Washing and other treatments for the anode enable the device to get a reduction in operation potential and improve in luminous efficiency. In a case of the anode using ITO, it is effective for the anode to receive UV-ozone treatment or plasma treatment.

The cathode supplies electrons to an electron injection layer, an electron transporting layer and a luminescent layer. In selecting the cathode, the adhesiveness to a layer adjacent to the cathode, such as an electron injection, electron-transporting or luminescent layer, the ionization potential and the stability are taken into consideration. As a material for the cathode, metals, alloys, metal halides, metal oxides, electrically conductive materials and mixtures thereof can be employed. Examples of such materials include alkali metals (e.g., Li, Na, K) and the fluorides thereof, alkaline earth metals (e.g., Mg, Ca) and the fluorides thereof, gold, silver, lead, aluminum, Na—K alloy or the mixture thereof, Li—Al alloy or mixture, Mg—Ag alloy or mixture, and rare earth metals (e. g., In, Yb). Of these materials, the materials having a work function of at most 4 eV are preferred over the others. In particular, aluminum, Li—Al alloy or mixture and Mg—Ag alloy or mixture are used to advantage. The cathode structure may be a single-layer of the compound or mixture as recited above or a lamination comprised of the compounds or mixtures as recited above. The suitable thickness of the cathode, though can be selected depending on the cathode material, is generally from 10 nm to 5 $\mu$m, preferably 50 nm to 1 $\mu$m, particularly preferably 100 nm to 1 $\mu$m. In forming the cathode, various known methods, such as an electron-beam method, a sputtering method, a resistance heating-utilized vapor deposition method and a coating method, can be adopted. The metals as recited above can be evaporated independently, or two or more thereof may be evaporated simultaneously. Further, it is possible to evaporate two or more different metals at the same time to form an alloy electrode, or to evaporate the previously prepared alloy. It is advantageous to the luminescent device that both anode and cathode have low sheet resistance, specifically 15 $\Omega/\square$ at the highest.

The material used for a luminescent layer may be any of materials capable of forming a layer which can function so as to receive hole injection from the anode, the hole injection layer or the hole-transporting layer as well as electron injection from the cathode, the electron injection layer or the electron-transporting layer when the electric field is applied thereto, permit the charges injected therein to move and enable the emission of light by providing a place for recombining the holes and the electrons. The luminescent layer contains the present cyclic azine compound. Also, it is possible to use therein other materials hitherto known to be luminescent. Examples of such materials include benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perinone derivatives, oxadiazole derivatives, aldazine derivatives, pyraridine derivatives, cyclopentadiene derivatives, bisstyrylanthracene derivatives, quinacridone derivatives, pyrrolopyridine derivatives, thiadiazolopyridine derivatives, styrylamine derivatives, aromatic dimethylidyne derivatives, various metal complexes represented by metal or rare earth complexes of 8-quinolinol derivatives, and polymeric compounds such as polythiophene, polyphenylene and polyphenylenevinylene. Although the luminescent layer has no particular restrictions as to the thickness, the suitable thickness thereof is generally from 1 nm to 5 $\mu$m, preferably 5 nm to 1 $\mu$m, particularly preferably nm 10 to 500 nm.

As to the method of forming the luminescent layer, there is no particular restrictions, but various methods including a resistance heating-utilized vapor deposition method, an electron-beam method, a sputtering method, a molecular lamination method, a coating method (e.g., a spin coating, cast coating or dip coating method) and an LB method can be adopted. Of these methods, resistance heating-utilized vapor deposition and coating methods are preferred over the others.

The materials for the hole injection layer and the hole-transporting layer may be any materials so long as they have any one of the functions as an injector of holes from the anode, a transferor of the holes and a barrier against electrons injected from the cathode. Examples of a material having one of such functions include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, and conductive polymers or oligomers, such as poly(N-vinylcarbazole) derivatives, aniline copolymers, thiophene oligomers and polythiophene. Furthermore, the present polymer containing the thienopyrazine ring(s) may be used as such a material. The thickness of the hole injection layer and the hole-transporting layer each, though it has no particular limitation, is generally from 1 nm to 5 $\mu$m, preferably 5 nm to 1 $\mu$m, particularly preferably 10 nm to 500 nm. Each of the hole injection layer and the hole-transporting layer may have a single-layer structure constituted of one or more of the materials recited above or a multiple-layer structure made up of at least two layers having the same composition or different compositions.

As a method of forming a hole injection layer and a hole-transporting layer, a vacuum evaporation method, an LB method and a method of coating a compound capable of injecting holes or/and transporting holes in the form of a solution or dispersion in an appropriate solvent (using, e.g., a spin coating, cast coating or dip coating method) can be adopted. In the case of a coating method, the compound can be dissolved or dispersed in the presence of a resin component. Examples of a resin component usable therein include polyvinyl chloride, polycarbonate, polystyrene, polymethyl methacrylate, polybuytl methacrylate, polyester, polysulfone, polyphenylene oxide, polybutadiene, poly(N-vinylcarbazole), hydrocarbon resin, ketone resin, phenoxy resin, polyamide, ethyl cellulose, polyvinyl acetate, ABS resin, polyurethane, melamine resin, unsaturated polyester resin, alkyd resin, epoxy resin and silicone resin.

The materials for the electron injection layer and the electron-transporting layer may be any materials so long as they have any one of the functions as an acceptor of the electrons injected from the cathode, a transporter of electrons and a barrier against holes injected from the anode. Examples of a material having such a function include triazole derivatives, oxazole derivatives, oxadiazole derivatives, fluorenone derivatives, anthraquinodimethane derivatives, anthrone derivatives, diphenylquinone derivatives, thiopyran dioxide derivatives, carbidimide derivatives, fluorenylidenemethane derivatives, distyrylpyrazine derivatives, tetracarboxylic acid anhydrides of aromatic condensed rings such as naphthalene and perylene, phthalocyanine derivatives, and various metal complexes represented by metal complexes of 8-quinolinol derivatives, metallophthalocyanines and metal complexes containing benzoxazole or benzothiazole ligands. Furthermore, the present polymer containing the thienopyrazine ring(s) may be used as such a material. The thickness of the electron injection layer and the electron-transporting layer each, though it has no particular limitation, is generally from 1 nm to 5 $\mu$m, preferably 5 nm to 1 $\mu$m, particularly preferably 10 nm to 500 nm. Each of the electron injection layer and the electron-transporting layer may have a single-layer structure constituted of one or more of the compounds as recited above, or a multiple-layer structure made up of at least two layers having the same composition or different compositions.

As a method of forming the electron injection layer and the electron-transporting layer, a vacuum evaporation method, an LB method and a method of coating the compound(s) capable of injecting electron or/and transporting electrons in the form of a solution or dispersion in an appropriate solvent (using, e.g., a spin coating, cast coating or dip coating method) can be adopted. In a case of adopting the coating method, the electron injection accepting or/and transporting compounds can be dissolved or dispersed in the presence of a resin component. Examples of a resin component usable therein include the same resins as employed for the hole injection and hole-transporting layers.

The materials for a protective layer may be any substances so long as they have a function capable of inhibiting the invasion of a device deterioration promoter, such as moisture or oxygen, into the device. Examples of such a substance include metals, such as In, Sn, Pb, Au, Cu, Ag, Al, Ti and Ni; metal oxides, such as MgO, SiO, $SiO_2$, $Al_2O_3$, GeO, NiO, CaO, BaO, $Fe_2O_3$, $Y_2O_3$ and $TiO_2$; metal fluorides, such as $MgF_2$, LiF, $AlF_3$ and $CaF_2$; polyethylene, polypropylene, polymethyl methacrylate, polyimide, polyurea, polytetrafluoroethylene, polychlorotrifluoroethylene, polydichlorodifluoroethylene, copolymer of chlorotrifluoroethylene and dichlorodifluoroethylene, copolymers prepared by polymerizing a mixture of tetrafluoroethylene and at least one comonomer, and fluorine-containing copolymers having cyclic structures in the main chain; a water-absorbing substance having a water absorption rate of at least 1%; and a moisture proof substance having a water absorption rate of at most 0.1%.

The protective layer also has no particular restriction as to the formation method, but any of a vacuum evaporation method, a sputtering method, a reactive sputtering method, a molecular beam epitaxy (MBE) method, a cluster ion beam method, an ion plating method, a plasma polymerization method (high frequency excitation ion plating method), a plasma chemical vapor deposition (CVD) method, a laser CVD method, a heat CVD method, a gas source CVD method and a coating method can be adopted for the formation thereof.

The present invention will now be illustrated in more detail by reference to the following examples. However, the invention should not be construed as being limited to these examples.

EXAMPLE 1

Synthesis of Exemplified Compound 25

In a 50 ml flask, 0.5 g (2.67 mmol) of 3,4-diaminothiophene dihydrochloride, 0.566 g (2.67 mmol) of 2,2'-pyridyl, 0.543 g (5.37 mmol) of triethylamine and 5 ml of ethanol were placed, and heated under ref lux for 30 minutes. The reaction mixture was cooled, admixed with active carbon, stirred for 30 minutes, and then underwent cerite filtration. The filtrate obtained was concentrated, and the resultant concentrate was recrystallized from ethanol to give 0.51 g of 2,3-di-(2-pyridyl)thienopyrazine. The yield was 65%.

Next 0.481 g (1.66 mmol) of 2,3-di-(2-pyridyl) thienopyrazine and 10 ml of tetrahydrofuran (THF) were placed in a 100 ml of flask, made into a solution, and then cooled down to −78° C. To this slurry, 1.66 ml (3.32 mmol) of a 2.0M lithium diisopropylamide (LDA) solution was added dropwise, and stirred for 10 minutes. Further thereto, 0.446 g (3.32 mmol) of cupric chloride was added. Then, two hours were spent for raising the temperature of the contents of the flask to 0° C. Subsequently thereto, the contents were stirred for one hour at 0° C. At the conclusion of the reaction, the reaction mixture was dropped into methanol with stirring. The precipitate thus formed was filtered off, washed with aqueous ammonia till the supernatant became colorless, and then filtered off again. The resultant precipitate was extracted with successive chloroform and methanol by means of a Soxhlet extractor. The extraction solvent was concentrated to give 0.1793 g of exemplified Compound 25 as a polymer. The yield was 38%. As a result of molecular weight determination by gel permeation chromatography (GPC) (reduction to polystyrene standard: THF elution), it was found that the polymer had the weight average molecular weight of 780 and the number average molecular weight of 360. And this polymer was soluble in chloroform.

In order to evaluate the electric conduction of this polymer, an ITO/Compound 25 (50 nm)/Ca—Al device was produced (by applying the polymer dissolved in chloroform to an ITO electrode formed on a glass substrate in accordance with a spin coating method, and then evaporating a Ca—Al electrode onto the polymer coat), and thereto the voltage of 6V was applied. As a result, the device showed the electric current value of 2250 $MA/CM^2$.

EXAMPLE 2

Synthesis of Exemplified Compound 30

Exemplified Compound 30 as a polymer was synthesized in the same manner as in Example 1, except that bis(4-methylphenyl)ethanedione was used in place of 2,2'-pyridyl. The yield was 100%. The weight average molecular weight and the number average molecular weight of this polymer determined by GPC (reduction to polystyrene standard; THF elution) were 3,400 and 1,500 respectively. This polymer was soluble in chloroform.

In order to evaluate the electric conduction of this polymer, an ITO/Compound 30 (50 nm)/Ca—Al device was produced (by applying the polymer dissolved in chloroform to an ITO electrode formed on a glass substrate in accordance with a spin coating method, and then evaporating a Ca—Al electrode onto the polymer coat), and thereto the voltage of 6V was applied. As a result, the device showed the electric current value of 2630 mA/cm2.

Comparative Example 1

In analogy with Example 1, an ITO/PPV (50 nm) /Ca—Al device was made by coating a PPV precursor solution (produced by Cambridge Display Technology Co., Ltd.) on a cleaned ITO substrate in accordance with a spin-coating method and then drying the coat at 150° C. for 2 hours in vacuo to form a PPV film (thickness: about 50 nm). When the voltage of 6V was applied, this device showed the electric current value of only 625 $mA/cm^2$.

EXAMPLE 3

A PPV precursor solution (produced by Cambridge Display Technology Co., Ltd.) was spin-coated on a cleaned ITO substrate, and dried in vacuo at 150° C. for 2 hours to form a PPV film (film thickness: about 40 nm). On this film, 20 mg of exemplified Compound 25 as a polymer dissolved in 2 ml of chloroform was spin-coated (at 1000 r.p.m. for 20 seconds). Then, a patterned mask (for adjusting each emission area to 5 mm×5 mm) was set on the organic thin film formed above, and further thereon, inside the vacuum evaporator, Mg and Ag were deposited simultaneously in a Mg/Ag ratio of 10/1 to form a metallic film having a thickness of 250 nm, followed by deposition of a 300 nm-thick Ag film ($8 \times 10^{-6}$ to $1 \times 10^{-5}$ Torr).

The luminescent characteristics were examined as follows:

The electroluminescent (EL) device obtained was made to luminesce by applying a DC constant voltage thereto via the ITO anode and the Mg/Ag cathode by means of a source measure unit, Model 2400, made by Toyo Technica Co., Ltd. And the luminance and the wavelength of the luminescence the device showed were measured with a luminometer BM-8, made by Topcon Co., and a spectrum analyzer PMA-11, made by Hamamatsu Photonics Co., respectively. Further, the device made was allowed to stand for 3 hours under the condition of 60° C.-20% RH, and then made to luminesce. The luminance of the thus aged device (operation voltage: 10V) was evaluated as a relative luminance (the value calculated taking the luminance measured just after making the device as 100). As a result of these measurements, the device was found to have the current density of 825 mA/cm$^2$ under 7V and give off green luminescence of 300 Cd/sqm-and the maximum luminescence wavelength (λmax) of 500 nm. The relative luminance after aging was 78.

EXAMPLE 4

A PPV precursor solution (produced by Cambridge Display Technology Co., Ltd.) was spin-coated on a cleaned ITO substrate, and dried in vacuo at 150° C. for 2 hours to form a PPV film (film thickness: about 40 nm) On this film, 20 mg of poly(2,5-pyridinediyl) dissolved in 2 ml of formic acid was spin-coated (at 1000 r.p.m. for 20 seconds). Further on this coat, 20 mg of exemplified Compound 4 as a polymer dissolved in 2 ml of chloroform was spin-coated (at 1000 r.p.m. for 20 seconds). Then, a patterned mask (for adjusting each emission area to 5 mm×5 mm) was set on those organic thin films, and further thereon, inside the vacuum evaporator, Mg and Ag were deposited simultaneously in a Mg/Ag ratio of 10/1 to form a metallic film having a thickness of 250 nm, followed by deposition of a 300 nm-thick Ag film (8×10$^{-6}$ to 1×10$^{-5}$ Torr).

The luminescence characteristics were examined in the same ways as in Example 3. As a result, the device was found to have the current density of 1035 mA/cm$^2$ under 7V and give off green luminescence of 501 Cd/sqm. The maximum luminescence wavelength (λmax) was 500 nm, and the relative luminance after aging was 82.

EXAMPLE 5

On a cleaned ITO substrate, Baytron P [a PEDOT-PSS solution (polydioxyethylenethienylene-polystyrenesulfonic acid doped material), a product of Bayer] was spin-coated (at 2000 r.p.m. for 60 seconds) and dried in vacuo at 100° C. for 1 hours to form a hole-transporting film (film thickness: about 40 nm). On this film, 20 mg of exemplified Compound 15, the copolymer synthesized by oxidative polymerization of 2,7-dibromofluorene and 5,7-dibromo-2,3-dihexylthienopyrazine (weight average molecular weight: 22,000), dissolved in 2 ml of chloroform was spin-coated (at 1000 r.p.m. for 20 seconds). Then, a patterned mask (for adjusting each emission area to 5 mm×5 mm) was set on those organic thin films, and further thereon, inside the vacuum evaporator, Mg and Ag were deposited simultaneously in a Mg/Ag ratio of 10/1 to form a metallic film having a thickness of 250 nm, followed by deposition of a 300 nm-thick Ag film (8×10$^{-6}$ to 1×10$^{-5}$ Torr).

The luminescence characteristics were examined in the same ways as in Example 3. As a result, the device was found to have the current density of 300 mA/cm$^2$ under 8V and give off blue luminescence of 470 Cd/sqm. The maximum luminescence wavelength (λmax) was 430 nm, and the relative luminance after aging was 77.

Comparative Example 2

In analogy with Example 3, an ITO/polyphenylenevinylene (50 nm)/Mg—Ag device was made, and the luminescence characteristics thereof were examined. As a result, the device was found to have the current value of 2025 mA/cm$^2$ when the voltage of 8V was applied thereto and show the luminance of only 120 Cd/sqm. The maximum luminescence wavelength (λmax) was 500 nm, and the relative luminance after aging was 28.

Comparative Example 3

In analogy with Example 4, an ITO/polyphenylenevinylene (50 nm)/poly(2,5-pyridinediyl) (30 nm)/Mg—Ag device was made, and the luminescence characteristics thereof were examined. As a result, the device was found to have the current value of only 25 mA/cm$^2$ when the voltage of 8V was applied thereto and show the luminance of only 135 Cd/sqm. The maximum luminescence wavelength (λmax) was 540 nm, and the luminescence from polyphenylenevinylene was not obtained. The relative luminance after aging was 28.

As can be seen from these experimental results, the lowest operation voltage of the luminescent devices using the present polymers were low, and the use of the present polymers in luminescent devices enabled the devices to exhibit luminescence of high luminance. Moreover, the luminescent devices using the present polymers caused only small decrease in luminance by storage under high temperatures. This demonstrates that the present luminescent devices have excellent durability.

Advantages of the Invention

In accordance with the invention, the organic luminescent devices produced can exhibit luminescence of high luminance and have high durability. In particular, they can have excellent luminescence characteristics even when produced by coating methods generally known to provide low luminance to the luminescent devices. Therefore, the invention enables the economically advantageous production of luminescent devices.

What is claimed is:

1. A luminescent device having a luminescent layer or at least two thin organic compound layers including a luminescent layer, between a pair of electrodes, wherein at least one of the layers comprises at least one polymer which is
   (a) a polymer having at least one partial structure represented by the following formula (I):

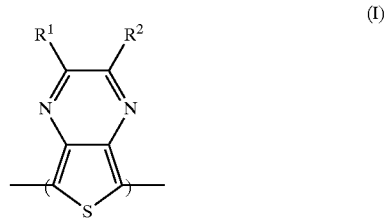

wherein R$^1$ and R$^2$ are the same or different, and each represents a hydrogen atom, a substituted or unsubstituted alkyl group, a substituted or unsubstituted aryl group, a substituted or unsubstituted alkoxy group, a substituted or unsubstituted aryloxy group, a substituted or unsubstituted alkylthio group, a substituted or unsubstituted arylthio group, a substituted or unsubstituted amino group, a substituted or unsubstituted heteroaryl group, or a substituted or unsubstituted aliphatic heterocyclic group; and $R^1$ and $R^2$ may combine with each other to form a ring, or (b) a polymer represented by the following formula (II):

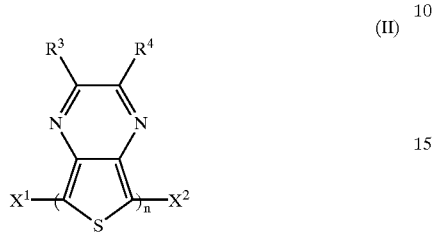

wherein $R^3$ and $R^4$ are the same or different, and each represent a substituted or unsubstituted aryl group except for an unsubstituted phenyl group, a substituted or unsubstituted aralkyl group, a substituted or unsubstituted aryl group which has a condensed ring, a substituted or unsubstituted aryloxy group, a substituted or unsubstituted alkylthio group, a substituted or unsubstituted arylthio group, a substituted or unsubstituted amino group, a substituted or unsubstituted nitrogen-containing heteroaryl group, a substituted or unsubstituted oxygen-containing heteroaryl group, or a substituted or unsubstituted aliphatic heterocyclic group, and $R^3$ and $R^4$ may combine with each other to form a ring; $X^1$ and $X^2$ are the same or different, and each represents a hydrogen atom, a halogen atom, an aliphatic hydrocarbon group, an aromatic hydrocarbon group or an aromatic heterocyclic group, and $X^1$ and $X^2$ may combine with each other to form a ring; and n is an integer of at least 2.

2. A luminescent device having a luminescent layer or at least two thin organic compound layers including a luminescent layer, between a pair of electrodes, according to claim 1 wherein at least one of the layers is a layer formed by coating at least one polymer which is a polymer having at least one partial structure represented by said formula (I) or is a polymer represented by said formula (II).

* * * * *